(12) United States Patent
Bhullar et al.

(10) Patent No.: US 7,889,826 B2
(45) Date of Patent: *Feb. 15, 2011

(54) PROCESS, VOLTAGE, TEMPERATURE INDEPENDENT SWITCHED DELAY COMPENSATION SCHEME

(75) Inventors: Gurpreet Bhullar, Nepean (CA); Graham Allan, Stittsville (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/026,813

(22) Filed: Feb. 6, 2008

(65) Prior Publication Data

US 2008/0143405 A1   Jun. 19, 2008

Related U.S. Application Data

(63) Continuation of application No. 10/702,502, filed on Nov. 7, 2003, now Pat. No. 7,349,513, which is a continuation of application No. 09/968,897, filed on Oct. 3, 2001, now Pat. No. 6,683,928, which is a continuation of application No. 09/106,755, filed on Jun. 30, 1998, now Pat. No. 6,327,318.

(51) Int. Cl.
*H03D 3/24* (2006.01)
(52) U.S. Cl. .................................... 375/374
(58) Field of Classification Search ................. 375/354, 375/371, 373–376; 370/516, 517; 327/156, 327/158, 160, 162
See application file for complete search history.

(56) References Cited

U.S. PATENT DOCUMENTS

| | | | |
|---|---|---|---|
| 3,829,843 A | 8/1974 | Cichetti, Jr. et al. | |
| 5,295,164 A | 3/1994 | Yamamura | |
| 5,515,403 A * | 5/1996 | Sloan et al. | 375/371 |
| 5,544,203 A | 8/1996 | Casasanta et al. | |
| 5,604,775 A | 2/1997 | Saitoh et al. | |
| 5,963,069 A | 10/1999 | Jefferson et al. | |
| 5,969,551 A | 10/1999 | Fujioka | |
| 6,327,318 B1 * | 12/2001 | Bhullar et al. | 375/374 |
| 6,683,928 B2 * | 1/2004 | Bhullar et al. | 375/374 |
| 7,349,513 B2 * | 3/2008 | Bhullar et al. | 375/375 |

FOREIGN PATENT DOCUMENTS

EP         0704975         4/1996

\* cited by examiner

*Primary Examiner*—Kevin M Burd
(74) *Attorney, Agent, or Firm*—Shin Hung; Borden Ladner Gervais LLP

(57) ABSTRACT

A delay compensation circuit for a delay locked loop which includes a main delay line having a fine delay line comprising fine delay elements and a coarse delay line comprising coarse delay elements, the main delay line being controlled by a controller, the delay compensation circuit comprising: an adjustable fine delay for modeling a coarse delay element, a counter for controlling the adjustable fine delay to a value which is substantially the same as that of a coarse delay element, a circuit for applying a representation of the system clock to the delay compensation circuit, and a circuit for applying the fine delay count from the counter to the controller for adjusting the fine delay line of the main delay line to a value which is substantially the same as that of a coarse delay element of the main delay line.

19 Claims, 3 Drawing Sheets

PROCESS, VOLTAGE, TEMPERATURE INDEPENDENT SWITCHED DELAY COMPENSATION SCHEME

This application is a continuation of U.S. patent application Ser. No. 10/702,502 filed Nov. 7, 2003 and issued as U.S. Pat. No. 7,349,513 on Mar. 25, 2008. U.S. patent application Ser. No. 10/702,502 is a continuation of U.S. patent application Ser. No. 09/968,897 filed Oct. 3, 2001, and issued on Jan. 27, 2004 as U.S. Pat. No. 6,683,928. U.S. patent application Ser. No. 09/968,897 is a continuation of U.S. patent application Ser. No. 09/106,755 filed Jun. 30, 1998, and issued on Dec. 4, 2001 as U.S. Pat. No. 6,327,318.

FIELD OF THE INVENTION

This invention relates to circuits in which fine delay elements are swapped with a coarse delay element during tracking, such as in a delay locked loop (DLL), and more particularly to a circuit and method for compensating for tracking differences between switchable coarse and fine delay elements.

BACKGROUND TO THE INVENTION

A digital delay locked loop is generally formed of a phase detector which detects the phase difference between a system clock and a feedback clock, and causes adjustment of a time delay circuit in the loop which causes the DLL output clock to be adjusted to lock with the system clock. The time delay is generally formed of an adjustable delay line.

Since the delay line is typically adjusted in steps, the finest delay resolution depends on the delay line step increments. In order to hold the locked condition, the delay line is continuously increased and decreased in step increments around a lock point, which results in inherent tracking jitter. In order to decrease the jitter, the delay line has been formed of plural coarse delay elements (CDE), forming a coarse delay line, in series with plural fine delay elements (FDE). After power-up of the circuit, the coarse delay line is adjusted, and once a lock point has almost been determined, the fine delay line is adjusted, which narrows the window around the lock point, to about 25 picoseconds, which represents the nominal amount of jitter in a typical application.

One fine delay line element (FDE) consists of 32 steps.times.25 picoseconds resulting in a time delay of about 0.8 ns, which approximately equals the time delay of a single stage of the coarse delay line. Once the delay locked loop has stabilized to the lock point, the delay line will automatically compensate for variations in delay caused by changing temperature and voltage conditions, by varying the fine delay line.

The fine delay line is reset to the halfway point after which it begins tracking.

In case of major drift, adjustments in the fine delay line will overrun its end. In that case, another coarse delay element is switched in series or an existing coarse delay element is switched out of the coarse delay line, and at the same time the fine delay line is adjusted to compensate for the coarse delay increase or decrease to provide the same total delay as before. However, now the fine delay line can be used again to compensate changes without immediate danger of overrun.

U.S. Pat. No. 5,544,203 invented by Casasanta et al, and U.S. Pat. No. 5,604,775 each discuss adjustment of a delay locked loop delay line using coarse and fine adjustment. However, none address the problem solved by the present invention, as will be elaborated below.

It is assumed in the prior art that interchanging (switching) the fine delay line steps for a coarse delay element provides an equal exchange of delay. Indeed, any differences between the two appear as jitter of about 300 ps on the DLL output clock. This amount of jitter was considered to be tolerable, given the prior art primary application of single data rate synchronous dynamic random access memories (SDRAMS). However, with the advent of tighter access time (T.sub.ac) specifications for double data rate (DDR) SDRAMs which are synchronized to the rising and falling edges of a system clock rather than only to the rising edge, even an amount of jitter of 200 ps-300 ps is becoming intolerable, considering the numerous sources adding to this jitter apart from the DDL, including input clock to data skew, clock duty cycle variations, inaccuracies in the actual input and output buffer delays with respect to its design model, etc.

DLL jitter itself consists of factors such as inherent tracking jitter and supply noise and substrate noise induced jitter. The inherent tracking jitter is caused by the up and down adjustments to the fine delay line while the DLL is in the locked condition, and as described above, is a variation equivalent to the delay achieved through a single step in the delay line. The jitter caused by switching between the coarse and fine delay elements caused by the mismatch between the elements is referred to as a switching jitter. This mismatch is highly dependent on the manufacturing process, and thus is hard to predict in the design stage. As the operating frequencies continue to increase, the switching jitter can undesirably reduce the data eye significantly. In addition, since this switching occurs only infrequently, it is inherently hard to detect during testing and can cause apparently randomly dropped bits when the part is in use in the field.

Analog techniques can be used to achieve a wide range of fine resolution tracking for various applications. In particular DLLs based on phase mixers have been shown to achieve high fine resolution tracking range through quadrature mixing. However, most analog based DLL designs employ some form of charge pumps for voltage controlled delay lines and as such they suffer from a limited resolution of the delay steps since the controlling element affects an entire delay line. In addition such DLLs often require a large acquisition time due to loop bandwidths being limited to a small fraction of the clock frequency to ensure stability of the loop. This effect also causes a poor jitter performance in analog DLLs.

Furthermore, analog DLL designs are inherently more susceptible to all sources of noise as their control variables (usually voltage) are reduced to achieve finer resolutions. In particular, SDRAMs provide a very noisy environment for analog blocks in form of supply and substrate noise, which when combined with area restrictions in SDRAMs, sometimes preventing adequate implementation of noise prevention techniques through layout, can result in unreliable DLLs in noisy field environments.

SUMMARY OF THE INVENTION

The present invention provides a circuit and a method of allowing a DLL to track with fine resolution delay elements, while providing a tracking range much larger than that provided by the fine delay line without the danger of producing switching jitter. The present invention accomplishes this by determining substantially the exact amount of fine delay line to compensate for a coarse delay element. This determination is done by providing a model of a coarse delay element and indicating to the fine delay line control the amount of fine delay to switch to substantially accurately substitute for the coarse delay element.

In accordance with an embodiment of the invention, a circuit for modeling a course delay element with a plurality of fine delay elements, the circuit comprising first and second parallel delay paths receiving a clock signal, the first path including a first plurality of delay elements and the second path including a second plurality of delay elements, a phase detector receiving first and second clock delay signals from the first and second delay paths respectively for detecting a phase difference between said first and second clock delay signals, the phase detector providing the phase difference to a counter and a decoder receiving a signal from the counter, the decoder being connected to the first plurality of delay elements within the first delay path for adjusting the delay provided by the first delay path until the first and second clock delay signals are in a locked state.

In accordance with another embodiment, a circuit for modeling a course delay element with a plurality of fine delay elements, the circuit including: (a) first and second parallel delay paths receiving a clock signal, the first path comprising a first plurality of delay elements and the second path including a second plurality of delay elements, (b) a phase detector receiving a first and second clock delay signals from the first and second delay paths respectively for detecting a phase difference between said first and second clock delay signals, the phase detector providing the phase difference to a counter, and (c) the counter generating a signal for controlling a plurality of delay elements within the first delay path for adjusting the delay provided by the first delay path until the delay provided by the first and second paths are substantially equal.

In accordance with another embodiment of the invention, A delay lock loop (DLL) comprising a circuit for modeling a coarse delay element with a plurality of fine delay elements, the circuit comprising: (a) first and second parallel delay paths receiving a clock signal, the first path including a first plurality of delay elements and the second path including a second plurality of delay elements, (b) a phase detector receiving first and second clock delay signals from the first and second delay paths respectively for detecting a phase difference between said first and second clock delay signals, the phase detector providing the phase difference to a counter, and (c) the counter generating a signal for controlling a plurality of delay elements within the first delay path for adjusting the delay provided by the first delay path until the first and second clock delay signals are in a locked state.

In accordance with another embodiment of the invention, A delay lock loop (DLL) comprising a circuit for modeling a coarse delay element with a plurality of fine delay elements, the circuit comprising: (a) first and second parallel delay paths receiving a clock signal, the first path including a first plurality of delay elements and the second path including a second plurality of delay elements, (b) a phase detector receiving a first and second clock delay signal from the first and second delay paths respectively for detecting a phase difference between said first and second clock delay signal, the phase detector providing the phase difference to a counter, and (c) the counter generating a signal for controlling a plurality of delay elements within the first delay path for adjusting the delay provided by the first delay path until the delay provided by the first and second paths are substantially equal.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 1:
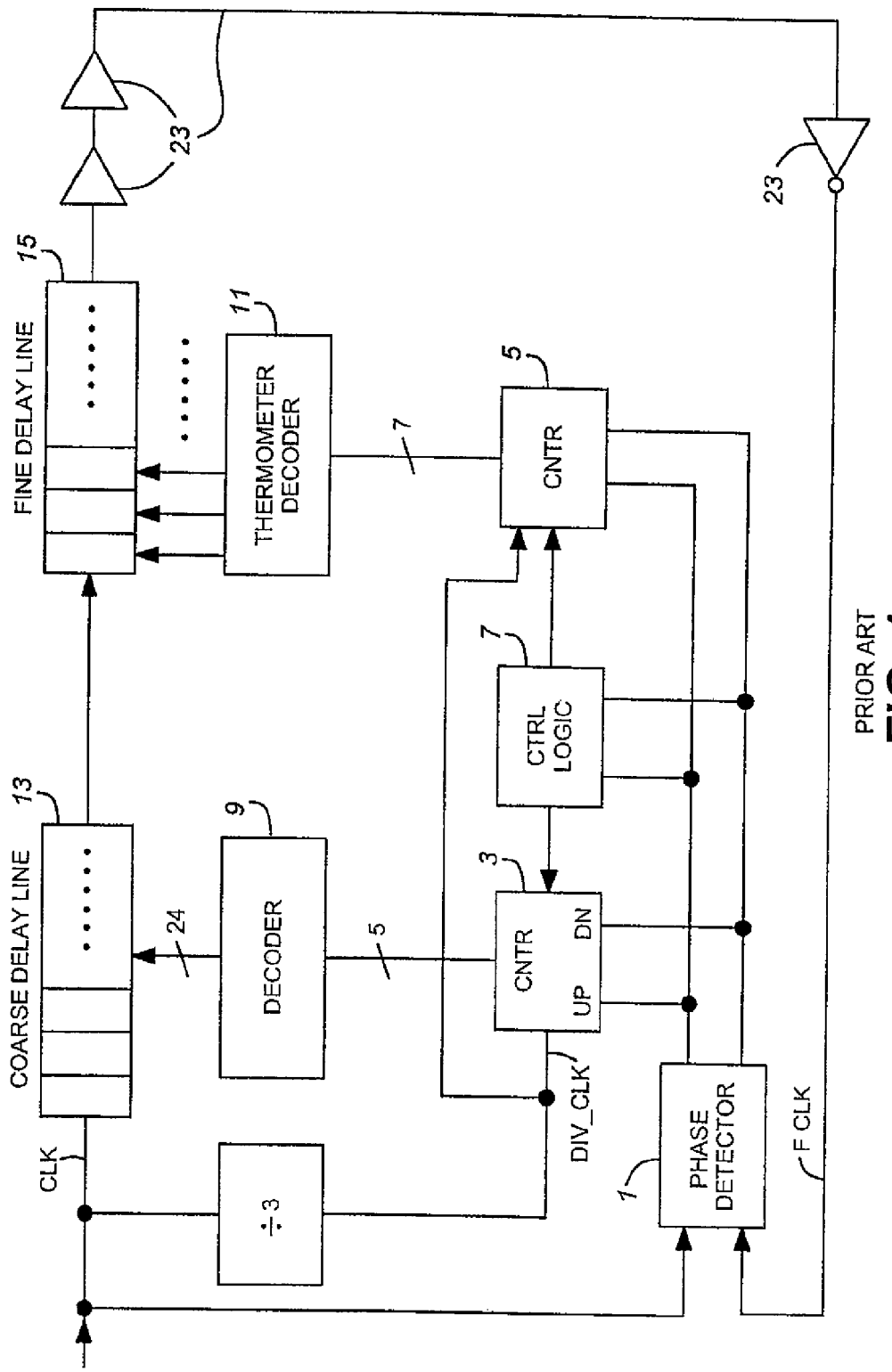
FIG. 1 is a block diagram of a delay locked loop (DLL) in accordance with the prior art.

FIG. 1 illustrates a DLL in accordance with the prior art. A phase detector 1 receives a system clock (CLK) signal and a feedback clock (FCLK) signal, compares the phase of the FCLK signal with that of the CLK signal, and issues up and down count control signals to a coarse adjust counter 3, and fine adjust counter 5. The up and down signals are also monitored by a control logic. (CTRL LOGIC) circuit 7, which controls counters 3 and 5.

Figure 2:
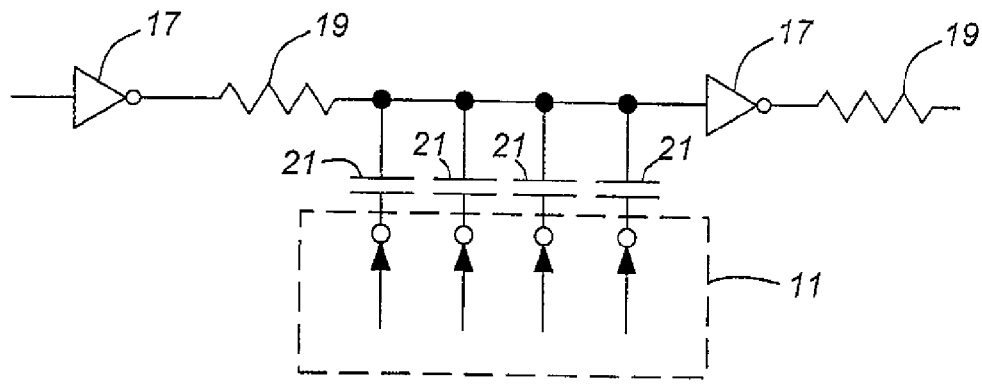
FIG. 2 is a schematic diagram of a fine delay element in accordance with the prior art.

The outputs of the counters 3 and 5 are coupled to decoders 9 and 11, which decode the counter outputs and apply control signals respectively to coarse delay line 13 and to fine delay line 15. The CLK signal is coupled to an input of the course delay line, and the output of the coarse delay line is coupled to the input of the fine delay line. Typically the coarse delay line 13 is formed of RC (resistor-capacitor) delay elements and inverters which are selectively connected in series with each other by respective multiplexers. Preferably the fine delay line is formed of a circuit which, as shown in FIG. 2, is comprised of a buffer inverter driver 17 followed by a series resistor 19 followed by a group of binary weighted capacitors 21 which are selectable by binary logic signals output from the decoder 11. The decoder 11 can be a thermometer decoder, which, to select any of 5 binary weighted capacitors for example, provides a 5 bit logic signal, one bit per capacitor. Thus for each segment of the typically 32 stages of the fine delay element, the decoder 11 will output a 5 bit logic capacitor selection signal. The fine delay line typically consists of plural fine delay elements.

The output of the fine delay line is coupled via a feedback circuit 23, to an input of the phase detector 1, providing the FCLK signal.

In the manner as described earlier, the CTRL LOGIC 7 controls the counter 3 and fine delay line counter 5 to insert as many coarse, and then fine, delay elements to lock the CLK and FCLK signals together as closely as possible. The CTRL LOGIC 7 senses underflow of the fine delay line counter 5 (i.e. the signal to the decoder 11 being all zeros), and thereupon controls the coarse delay line counter 3 to count one down, and controls the fine delay line counter 5 to provide a count signal to the decoder 11, which is up 32 steps, which compensates for the decrease in one coarse delay line element. The switching described above is thus performed.

A more detailed description of the circuit is believed to be redundant for the reason that it is well understood by persons skilled in the art.

As noted earlier, when the switching occurs, if the fine to coarse element substitution is not accurate due to the elements not being exactly the same in time delay, switching jitter occurs which is not tolerable for high speed parts.

Figure 3:
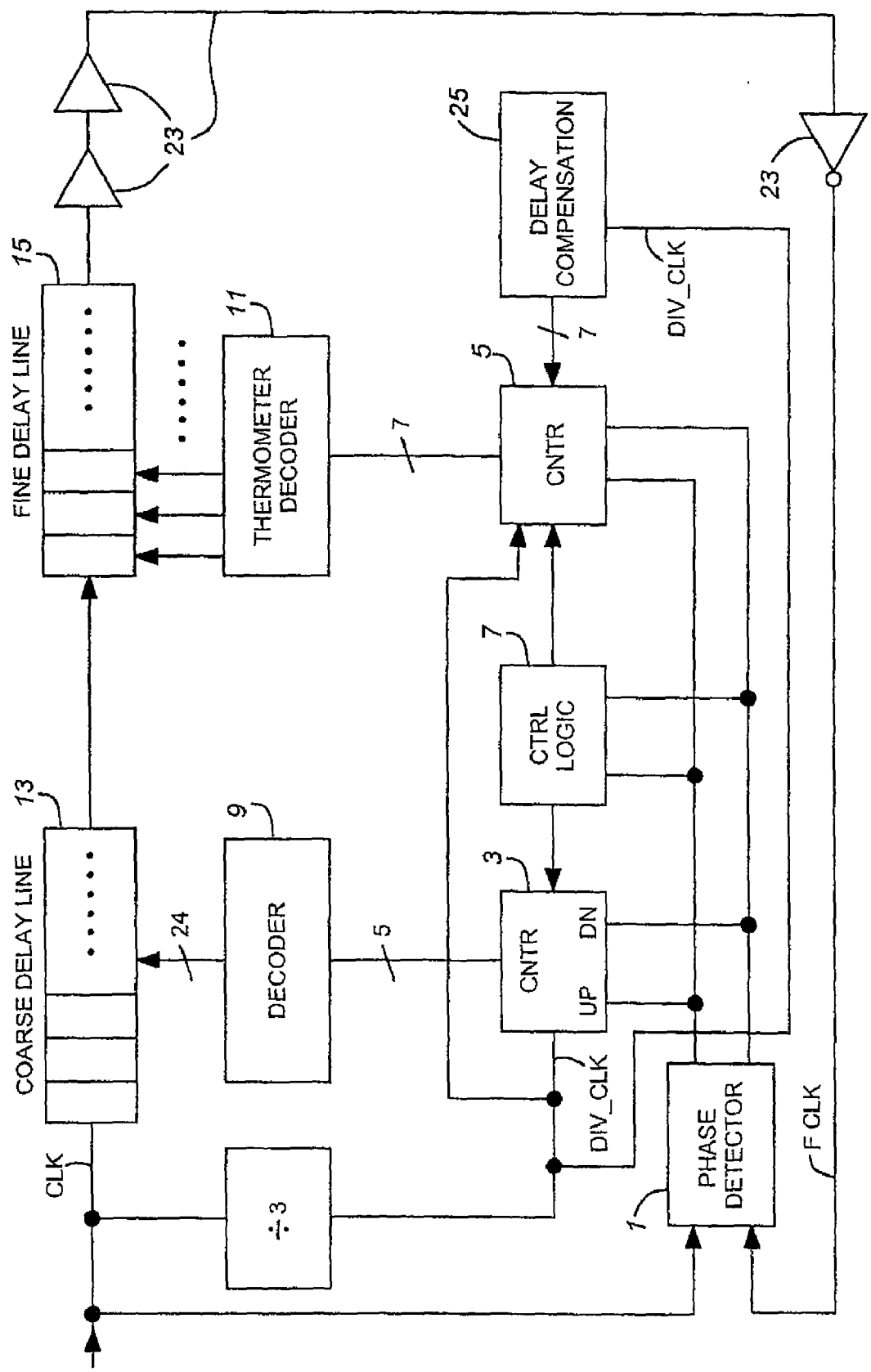
FIG. 3 is a block diagram of a DLL in accordance with an embodiment of the present invention.

In accordance with an embodiment of the present invention as shown in FIG. 3, an auxiliary control for the fine counter 5 which provides delay compensation 25 is included in the aforenoted circuit. In general operation, the delay compensation 25 receives the clock signal CLK, (or preferably a divided version of CLK to reduce power consumption) and provides a value to the fine counter 5 which indicates the substantially exact value of fine control elements to use to compensate for one coarse delay line element.

Figure 4:
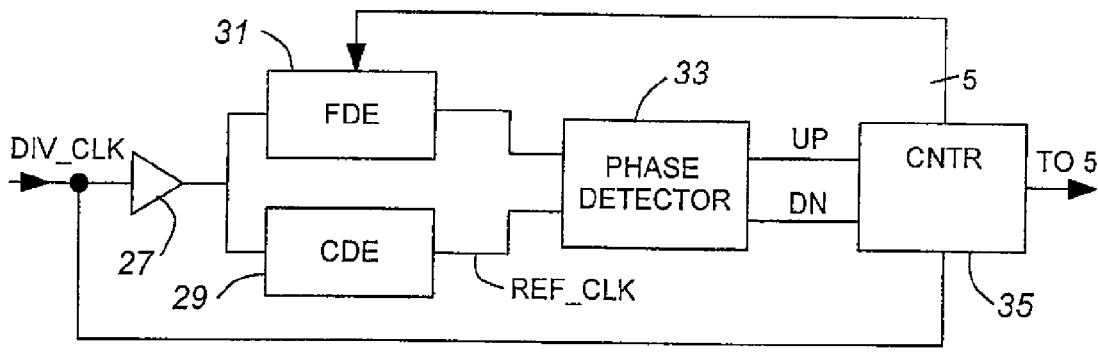
FIG. 4 is a block diagram of a delay compensation block used in the diagram of FIG. 3 which contains basic elements used to understand the present invention.

FIG. 4 illustrates the basic elements of an intelligent dynamic delay compensation circuit which determines the number of fine delay steps required to replace a coarse delay element to be switched out of the main delay line such that the delay mismatch is reduced to less than one fine delay step. This circuit allows the DLL to track the system clock CLK by using high resolution fine delay steps, while covering a range much larger than that provided by the fine delay line, without the inherent danger of switching jitter. It also allows fine delay steps of high resolution to be employed without compromising locking time, integrated circuit area and power.

The clock CLK or a divided version thereof (DIV_CLK) is applied via a buffer 27 to two delay paths in parallel, a reference coarse delay path which contains a coarse delay element 29 to be modelled, and a variable fine delay path which contains a controllable number of fine delay elements 31. The outputs of the two paths are coupled to respective inputs of a phase detector 33. Outputs of the phase detector 33 are up and down control signals which result from the phase comparison; these signals are applied to a counter 35, which also receives the clock signal CLK or a divided version of the clock. The counter 35 provides a control signal for controlling the number of fine delay elements in the fine delay path of the delay line of FIG. 3, which will be stable when the delays of both delay paths are substantially equal. This represents accurately the number of fine delay steps which should be substituted for one coarse delay element. The count of the counter 35 at this point is output to the counter 5 of the main DLL described with reference to FIG. 3. The circuit of FIG. 4 (or the more detailed preferred circuit of FIG. 5) is represented by element 25 of FIG. 3.

Since the delay elements in the compensation circuit 25 of FIG. 3 are manufactured simultaneously with those of the delay lines 13 and 15, and are preferably located on the chip in close proximity, they will exhibit substantially the same characteristics.

In a preferred embodiment of the present invention the coarse delay element 29 is an RC based delay well known in the art driven by an inverter, and has a delay of about 0.8 ns. The fine delay element 31 consists of 32 fine steps, each of the form shown in FIG. 2, each step being about 25 ps.

In the main delay line of FIG. 3, preferably four fine delay elements are used to form a fine delay line 15 of +/−64 fine steps, each element being implemented using binary weighted capacitor based RC delay elements. Without the compensation circuit, during switching, one fine delay element or 32 fine steps are substituted by a coarse delay element.

The phase detector 33 samples the system CLK or delayed CLK (DIV_CLK) at the rising edge of CLK or DIV_CLK (the output of the coarse delay path 29) and indicates by its output up and down signals whether the DIV_CLK is early or late with respect to REF_CLK. The phase detector can be any implementation of a meta-stable hardened rising edge triggered D flip-flop.

The CNTR 35 is preferably a 6 bit up/down binary counter, which is reset to half of its value, i.e. 32 steps. The counter is clocked from the input clock DIV_CLK and counts up or down depending on the output of the phase detector.

Figure 5:
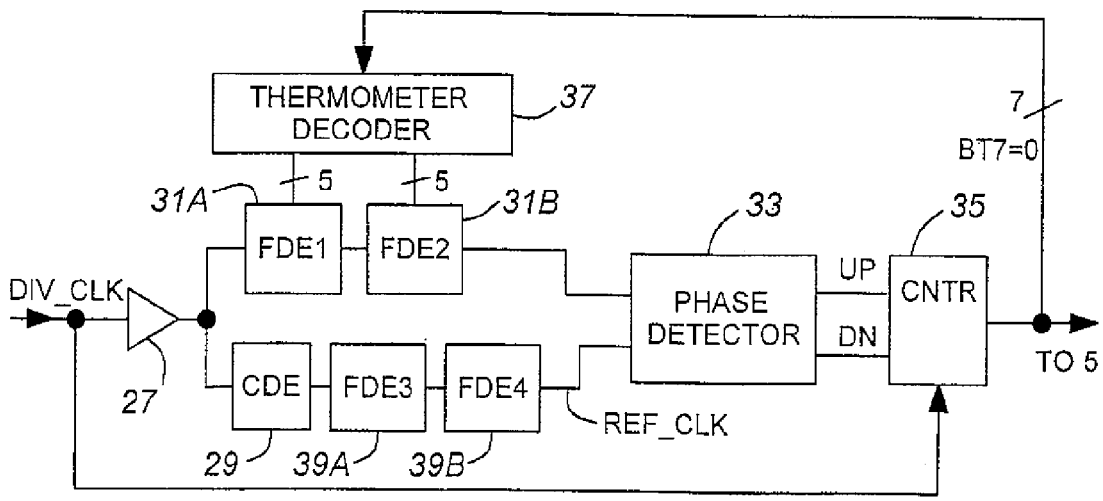
FIG. 5 is a block diagram illustrating the delay compensation block of FIG. 4 in more detail, in accordance with a preferred embodiment of the invention.

FIG. 5 illustrates a preferred form of the invention, in which two of the aforenoted fine delay elements FDE1 and FDE2 (elements 31A and 31B) are shown serially connected. The elements are selected by means of a thermometer decoder 37 driven by the output of counter 35.

The coarse delay path also includes additional fine delay elements FD3 and FD4 (elements 39A and 39B) which have intrinsic delays which are equal to the minimum delay of the elements 31A and 31B respectively. These are added because one coarse delay interval of a coarse delay element 13 could be greater than that of one nominal coarse delay element, and the additional fine delay elements 39A and 39B add to the interval of CDE 29 to at least equal to the delay interval which is greater than one nominal delay element.

In operation, the clock input is driven by DIV_CLK, a divided version of the main clock, to reduce power consumption. The DIV_CLK is then buffered by buffer 27 and is delayed through the above-described two delay paths. The fine delay elements 39A and 39B have their control inputs set to 0, so that the path through them includes only their intrinsic delay.

The fine delay path is comprised of the two fine delay elements 31A and 31B which have their control inputs fed by the counter 35 output. In this configuration the DIV_CLK is delayed by tCDE+2.times.tFDE(0) through the coarse delay path, where tFDE(0) is the intrinsic delay of a fine delay element, and tCDE is the time delay of a coarse delay element.

DIV_CLK is delayed by tFDE(I)+2.times.tFDE(0) through the fine delay path, where I is the counter output and can vary from 0 to 64.

The phase detector samples DIV_CLK at the rising edge of REF_CLK and indicates whether DIV_CLK is late or early with respect to REF_CLK. The counter uses the phase detector's output to count up if DIV_CLK is early and down if DIV_CLK is late. The output of the counter is used by the fine delay elements FDE1 and FDE2 (31A and 31B) to reduce the error on DIV_CLK. Thus I is adjusted by the above-described feedback mechanism so that tFDE(I)+2.times.tFDE(0)=tCDE+2.times.tFDE(0); or in other words, until tFDE(I)=tCDE. This ensures that the maximum error on DIV_CLK is no more than tFDE(I), or approximately 25 ps.

Once the error has been reduced to less than one fine delay element step, the counter counts one up and one down to stay within the above error range. In this state the circuit is in lock. Once in the locked state, I is continually updated as the temperature and voltage conditions change, thereby providing an accurate count for the fine delay elements that ensures minimum mismatch between the coarse delay and fine delay element delays across process parameters and temperature and voltage drifts.

The output of the counter 35 can be loaded in parallel into another counter which can be implemented within the counter 5 of FIG. 3 and can be used to control the entire fine delay line 15 in the main delay line whenever there is an overflow condition and switching between coarse and fine elements is required. A control signal can be used to add I to the fine delay line control output of this other counter by simply loading I into the other counter or by subtracting I from the other counter by loading the 1's complement of I into the other counter. This can be used to account for both overflow and underflow conditions.

For example, if the main delay locked loop is tracking by decreasing the delay and reaches an underflow (all 0's) condition, it must switch out a coarse delay element and add an equivalent amount of fine delay controlled through a count in the other counter. Thus in the all 0 or underflow condition I from the counter 35 is added to the other counter 5 by simply loading the count I into the other counter 5. However, during overflow, the other counter 5 contains all 1's and thus the counter 35 output I must be subtracted from all 1's to get the desired operation. This subtraction from all 1's is simply achieved through the loading of 1's complement of I into the other counter.

While the above-described embodiments are digital whereby counters are used to determine the compensated fine delay to be used during switching, such compensation can be achieved using other means. For example, a phase accumulator can be used instead of the phase detector 33 to compensate the delay by using voltage controlled delay elements. The error voltage achieved through this implementation can then be added or subtracted from the control voltage used to drive a voltage controlled delay line.

In addition, the input drive conditions of the two paths feeding the coarse and fine paths in the structure of FIG. 5 can be matched, and the output loading conditions can be established to accurately model the actual operating conditions of the coarse and fine delay elements of the main DLL.

While the above embodiments have been described using the DLL as the circuit to which they are applied in order to reduce switching jitter, the concepts can be used in other applications that involve tracking delays with respect to any reference delay path. For example, the invention can be used in clock recovery circuits, pin timing tuners used in integrated circuit testers, etc.

A person understanding this invention may now conceive of alternate embodiments and enhancements using the principles described herein. All such embodiments and enhancements are considered to be within the spirit and scope of this invention as defined in the claims appended hereto.

What is claimed:

1. A circuit for modeling a coarse delay element with a plurality of fine delay elements, the circuit comprising:
    first and second parallel delay paths for receiving a clock signal, the first path including
    a plurality of fine delay elements, and the second path including the same number of fine delay elements as the first path and a coarse delay element, each of the fine delay elements within the second path having a fixed delay for providing an output signal delayed relative to a received input signal by a constant duration of time;
    a phase detector for receiving first and second clock delay signals from the first and second delay paths respectively, for detecting a phase difference between the first and second clock delay signals, and for providing the phase difference to a counter; and
    a decoder for receiving a signal from the counter, the decoder being connected to the fine delay elements within the first delay path for adjusting a delay provided by the first delay path.

2. The circuit according to claim 1, wherein a delay provided by the first delay path is selectable by binary logic signals.

3. The circuit according to claim 1, wherein the fixed delay of the fine delay elements within the second delay path corresponds to an intrinsic delay substantially equal to a minimum delay of the fine delay elements within the first delay path.

4. The circuit according to claim 1, wherein the first delay path consists of fine delay elements.

5. The circuit according to claim 1, wherein the phase detector comprises a flip-flop circuit.

6. The circuit according to claim 1, wherein the counter is a count-up count-down type counter.

7. The circuit according to claim 1 further comprising a Delay Lock Loop (DLL), the DLL comprising:
    a coarse delay line for receiving a system clock;
    a fine delay line coupled to an output of the coarse delay line for providing a delay clock signal; and
    a main phase detector for receiving the system clock and the delay clock signals, the main phase detector coupled to a main fine counter being adjusted by the signal from the counter for adjusting the fine delay line and a main coarse counter for adjusting a delay provided by the coarse delay line.

8. The circuit according to claim 7, wherein the count from the counter is provided to the main fine counter.

9. The circuit according to claim 8, wherein the count provided by the counter to the main fine counter is substantially equal to a number of delays provided by the fine delay elements within the fine delay line that correspond to a delay provided by a coarse delay element within the coarse delay line.

10. A circuit for modeling a coarse delay element with a plurality of fine delay elements, the circuit comprising:
    first and second parallel delay paths for receiving a clock signal, the first path including
    a plurality of fine delay elements, and the second path including the same number of fine delay elements as the first path and a coarse delay element, each of the fine delay elements within the second path having a fixed delay for providing an output signal delayed relative to a received input signal by a constant duration of time;
    a phase detector for receiving the first and second clock delay signals from the first and second delay paths respectively, and for detecting a phase difference between the first and second clock delay signals; and
    a counter for receiving the phase difference from the phase detector and for generating a signal for adjusting a delay provided by the first delay path delay.

11. The circuit according to claim 10, wherein a delay provided by the first delay path is selectable by binary logic signals.

12. The circuit according to claim 10, wherein the fixed delay of the fine delay elements within the second delay path corresponds to an intrinsic delay substantially equal to a minimum delay of the fine delay elements within the first delay path.

13. The circuit according to claim 10, wherein the first delay path consists of fine delay elements.

14. The circuit according to claim 10, wherein the phase detector comprises a flip-flop circuit.

15. The circuit according to claim 10, wherein the counter is a count-up count-down type counter.

16. The circuit according to claim 10 further comprising a Delay Lock Loop (DLL), the DLL comprising:
    a coarse delay line for receiving a system clock;
    a fine delay line coupled to an output of the coarse delay line for providing a delay clock signal; and
    a main phase detector for receiving the system clock and the delay clock signals, the main phase detector coupled to a main fine counter being adjusted by the signal from the counter for adjusting the fine delay line and a main coarse counter for adjusting a delay provided by the coarse delay line.

17. The circuit according to claim 16, wherein the count is provided to the main fine counter.

18. The circuit according to claim 16, wherein the signal provided by the counter to the main fine counter is substantially equal to a number of delays provided the fine delay elements within the fine delay line that correspond to a delay provided by a coarse delay element within the coarse delay line.

19. A delay lock loop (DLL) comprising a circuit for modeling a coarse delay element with a plurality of fine delay elements, the circuit comprising:

first and second parallel delay paths for receiving a clock signal, the first path including a plurality of fine delay elements and the second path including the same number of fine delay elements as the first path and a coarse delay element, each of the fine delay elements within the second path having a fixed delay for providing an output signal delayed relative to a received input signal by a constant duration of time;

a phase detector for receiving first and second clock delay signals from the first and second delay paths respectively, for detecting a phase difference between the first and second clock delay signals, and for providing the phase difference to a counter; and a decoder for receiving a signal from the counter, and for providing signals to the first delay path for adjusting a delay provided by the first delay path.

\* \* \* \* \*